(12) United States Patent
Rekhi et al.

(10) Patent No.: US 12,438,114 B2
(45) Date of Patent: Oct. 7, 2025

(54) FLEX BONDED INTEGRATED CIRCUITS

(71) Applicant: Meta Platforms, Inc., Menlo Park, CA (US)

(72) Inventors: Sandeep Rekhi, San Jose, CA (US); Pradip Sairam Pichumani, Bellevue, WA (US)

(73) Assignee: Meta Platforms, Inc., Menlo Park, CA (US)

( * ) Notice: Subject to any disclaimer, the term of this patent is extended or adjusted under 35 U.S.C. 154(b) by 386 days.

(21) Appl. No.: 17/698,134

(22) Filed: Mar. 18, 2022

(65) Prior Publication Data
US 2023/0299035 A1    Sep. 21, 2023

(51) Int. Cl.
*H01L 23/00* (2006.01)
*H01L 23/552* (2006.01)

(52) U.S. Cl.
CPC ............ *H01L 24/40* (2013.01); *H01L 23/552* (2013.01); *H01L 24/77* (2013.01); *H01L 24/84* (2013.01); *H01L 2224/40227* (2013.01); *H01L 2224/77343* (2013.01); *H01L 2224/7755* (2013.01); *H01L 2224/84047* (2013.01); *H01L 2224/8412* (2013.01); *H01L 2224/84207* (2013.01); *H01L 2924/3025* (2013.01)

(58) Field of Classification Search
CPC ...................................................... H01L 24/40
USPC ....................................................... 257/659
See application file for complete search history.

(56) References Cited

U.S. PATENT DOCUMENTS

| | | | |
|---|---|---|---|
| 4,941,033 A | 7/1990 | Kishida | |
| 6,867,668 B1* | 3/2005 | Dagostino | H01L 23/66 |
| | | | 333/260 |
| 7,339,268 B1* | 3/2008 | Ho | H01L 23/3735 |
| | | | 257/E23.101 |
| 2006/0185892 A1* | 8/2006 | Guengerich | H01L 24/46 |
| | | | 257/E23.068 |
| 2009/0108416 A1 | 4/2009 | Fjelstad et al. | |
| 2012/0241795 A1* | 9/2012 | Chang | G02B 6/428 |
| | | | 257/E33.071 |
| 2019/0221538 A1 | 7/2019 | Chen | |

FOREIGN PATENT DOCUMENTS

| | | | | |
|---|---|---|---|---|
| CN | 205623001 U | * | 10/2016 | |
| EP | 1587350 A1 | * | 10/2005 | ......... H01L 23/4985 |

OTHER PUBLICATIONS

International Search Report and Written Opinion for International Application No. PCT/US2023/015365, mailed Jul. 14, 2023, 8 pages.

* cited by examiner

*Primary Examiner* — Ajay Arora
(74) *Attorney, Agent, or Firm* — EVERSHEDS SUTHERLAND (US) LLP

(57) ABSTRACT

Embodiments relate to an integrated circuit package having an integrated circuit die connected to a package substrate through conductors of a flex cable. The flex cable includes an insulating housing made of an insulating material and a plurality of conductors disposed inside the insulating housing. Each conductor of the plurality of conductors is connected to a first contact of a plurality of contacts of the integrated circuit die and a second contact of a plurality of contacts of the package substrate.

20 Claims, 13 Drawing Sheets

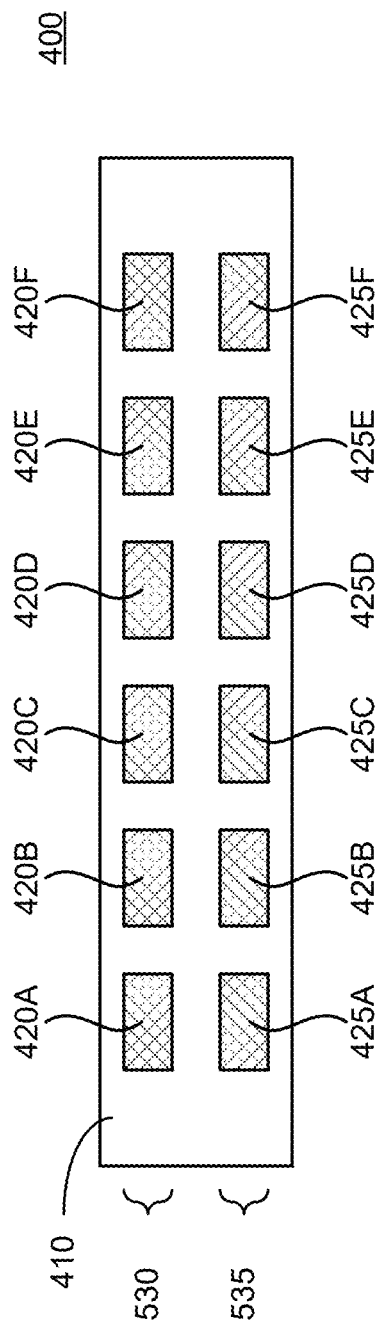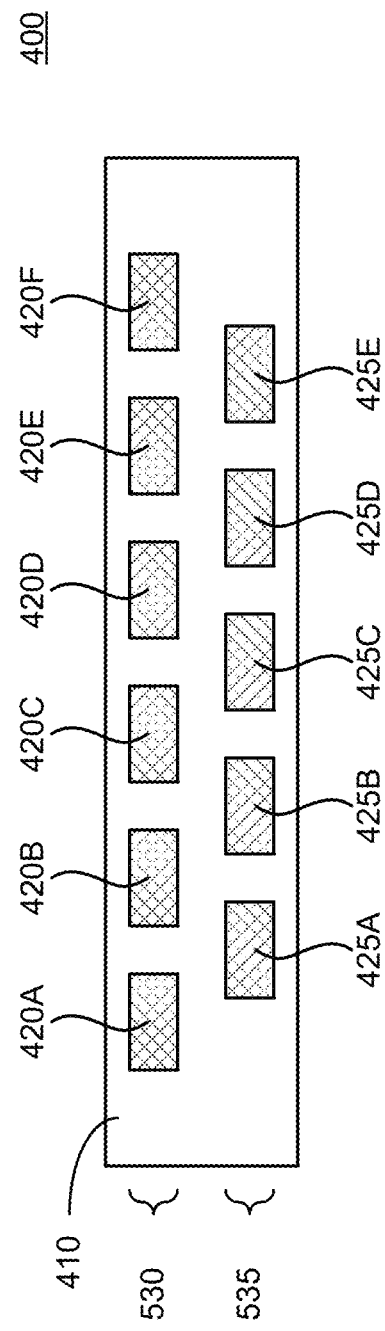

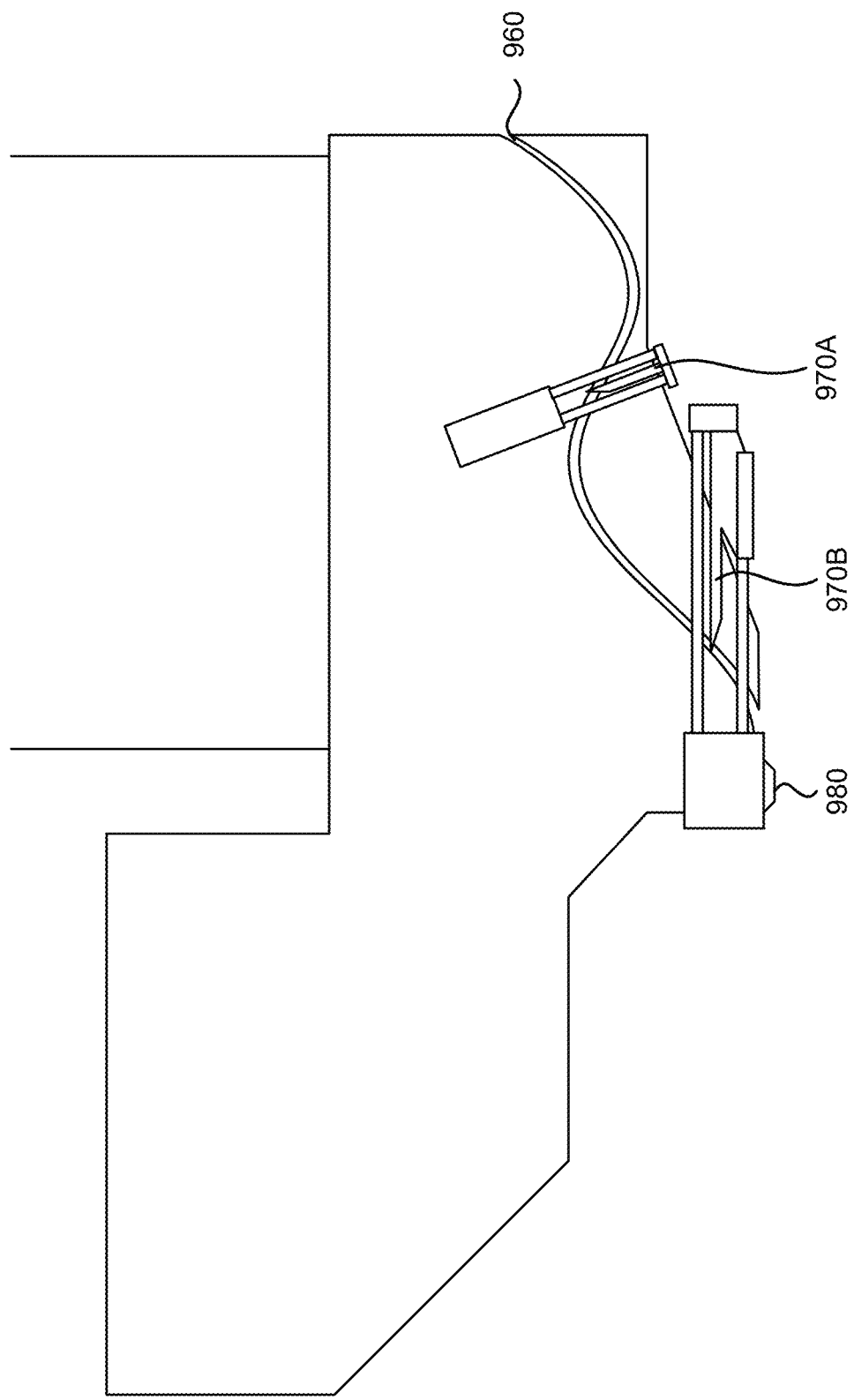

FLEX BONDED INTEGRATED CIRCUITS

BACKGROUND OF THE INVENTION

1. Field of the Disclosure

The present disclosure relates to integrated circuit fabrication and more specifically to electrically connecting an integrated circuit die to a packaging substrate.

2. Description of the Related Art

As integrated circuits become more complex, the process for making those integrated circuits also become more complex. For example, as integrated circuits evolve, the size of the components inside an integrated circuit die decreases. Moreover, the numbers of input and output contacts or terminals may increase. Those input and output contacts need to be connected to an external component (such as a package substrate or printed circuit board) to allow external interaction with the integrated circuit die. One of the approaches for bonding integrated circuits to the next level i.e., package or circuit board, is to wire bond each contact pad individually. Other approaches may include solder bumping (flip chip), wafer to wafer bonding, etc. The wire bonding process can be resource intensive due to its time consuming bonding process for each integrated circuit. Moreover, the individual wires very thin to match the size of the contact pads on the die making them very fragile. Finally, to reduce the possibility of the wires from breaking, a loop and slack are added to the wires, increasing the amount of space occupied by the wires.

SUMMARY

Embodiments relate to an integrated circuit package having an integrated circuit die connected to a package substrate through conductors of a flex cable. The integrated circuit die implements an integrated circuit and includes a first plurality of contacts. The package substrate includes a second plurality of contacts, each corresponding to a contact of the first plurality of contacts of the integrated circuit die. The flex cable includes an insulating housing made of an insulating material and a plurality of conductors disposed inside the insulating housing. Each conductor of the plurality of conductors is connected to a first contact of the first plurality of contacts of the integrated circuit die and a second contact of the second plurality of contacts of the package substrate.

Moreover, embodiments relate to a system for connecting an integrated circuit die to a package substrate. The system includes a tray holder for holding a tray carrying one or more integrated circuit stacks having a package substrate and an integrated circuit die, and a flex cable bonding head. The flex cable bonding head includes a first cutter, a second cutter, and a thermosonic bonding head. The first cutter is configured to cut the flex cable along a first cut line at a first angle to expose a first surface of the plurality of conductors of the flex cable. The second cutter is configured to cut the flex cable along a second cut line at a second angle to expose a second surface of the plurality of conductors of the flex cable. The thermosonic bonding head is configured to bond the first surface of the plurality of conductors to a first plurality of contacts of the integrated circuit die, and to bond the second surface of the plurality of conductors to a second plurality of contacts of the package substrate.

BRIEF DESCRIPTION OF THE DRAWINGS

The teachings of the embodiments can be readily understood by considering the following detailed description in conjunction with the accompanying drawings.

FIGS. 5A and 5B illustrate cross-sectional views across a transversal plane (X-Y plane) of the flex cable of FIG. 4A, according to various embodiments.

FIG. 9C illustrates a diagram of the flex cable bonding head, according to one or more embodiments.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to an integrated circuit package having an integrated circuit die electrically connected to a package substrate (such as a laminate). The integrated circuit die is connected to the package substrate through a flex cable having a proximal end bonded to a contact on a top surface of the integrated circuit, and a distal end bonded to a contact on a top surface of the package substrate.

Integrated Circuit Package Using Flex Connectors

Figure 1A:
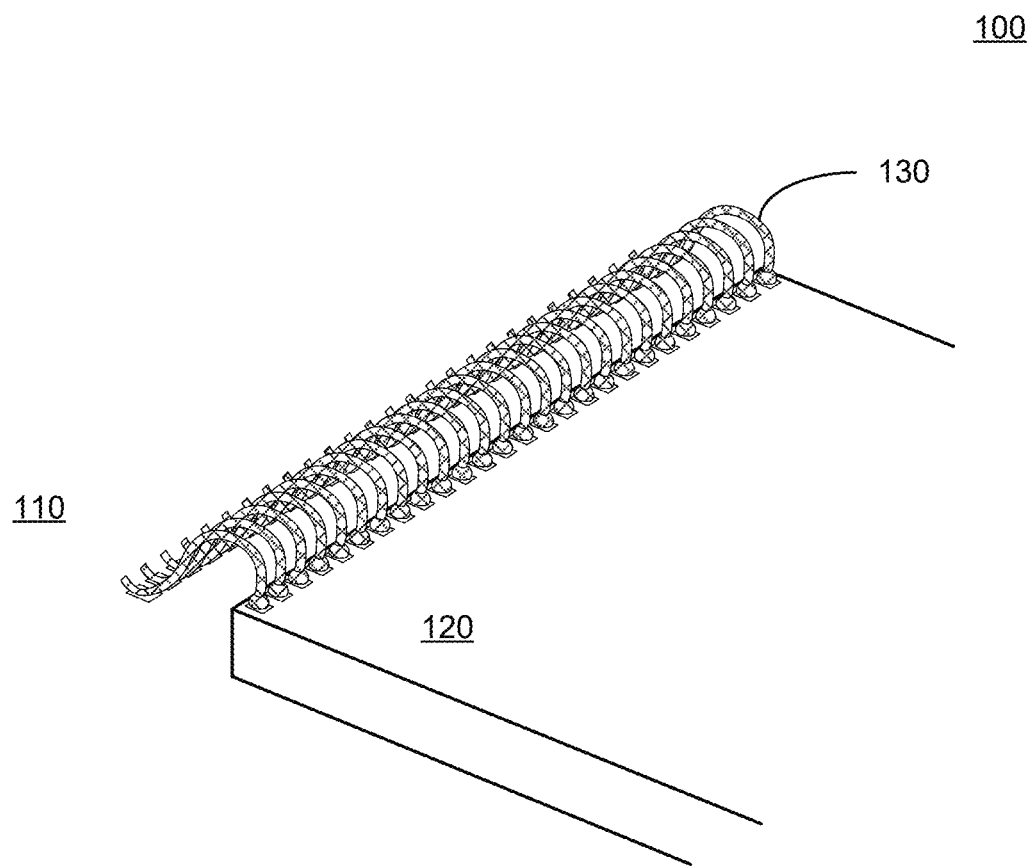
FIG. 1A illustrates a perspective view of an integrated circuit connected to a packaging substrate using wire bonds, according to one or more embodiments.
Figure 1B:
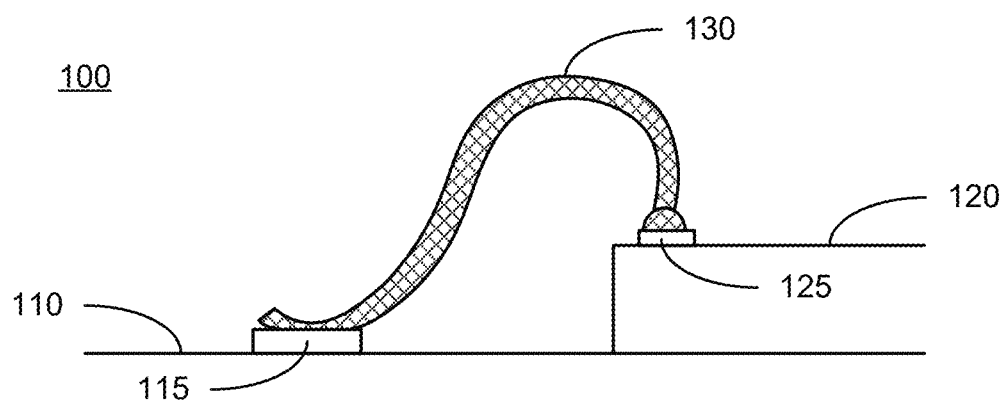
FIG. 1B illustrates a cross-sectional side view of an integrated circuit connected to a packaging substrate using a wire bond, according to one or more embodiments.

FIG. 1A illustrates a perspective view of an integrated circuit connected to a packaging substrate using wire bonds, according to one or more embodiments. FIG. 1B illustrates a cross-sectional side view of an integrated circuit connected to a packaging substrate using a wire bond, according to one or more embodiments.

The integrated circuit package 100 includes an integrated circuit die 120 and a package substrate 110. The integrated circuit die 120 includes a set of contacts 125. The package substrate 110 includes a set of contacts 115. In some embodiments, each contact 115 of the set of contacts of the package substrate corresponds to a contact 125 of the set of contacts of the integrated circuit die 120. Each of the contacts 115 of the set of contacts of the package substrate may be configured to provide or receive an electrical signal (such as a data signal, a reference voltage, or a supply voltage) to or from the integrated circuit die. Similarly, each contact 125 of the set of contacts of the integrated circuit die may be configured to provide or receive an electrical signal to or from the package substrate.

Each contact 125 of the set of contacts of the integrated circuit die 120 is connected to a corresponding contact 115 of the set of contacts of the package substrate 110 via wire 130. For example, in the embodiment shown in FIGS. 1A and 1B, each contact 125 of the set of contacts of the integrated circuit die 120 is connected to a corresponding contact 115 of the set of contracts of the package substrate 110 via wire bond. The wire bond may include a first end (e.g., a proximal end) that is bonded to a contact 125 of the set of contacts of the integrated circuit die 120, and a second end (e.g., a distal end) that is bonded to a contact 115 of the set of contacts of the package substrate 110. In some embodiments, the wire bond is bonded to a contact using ultrasonic or thermosonic bonding. However, bonding cables can be fragile and may be prone to breaking. To reduce the likelihood of damage, an amount of slack is added to the bonding wires to reduce the amount of stress the bonding wires are exposed to. The slack added to the bonding wires increase the amount of space occupied by the bonding wires. For example, the slack added to the bonding wires increase a height of the bonding wires or a vertical space used by the bonding wires.

Figure 2A:
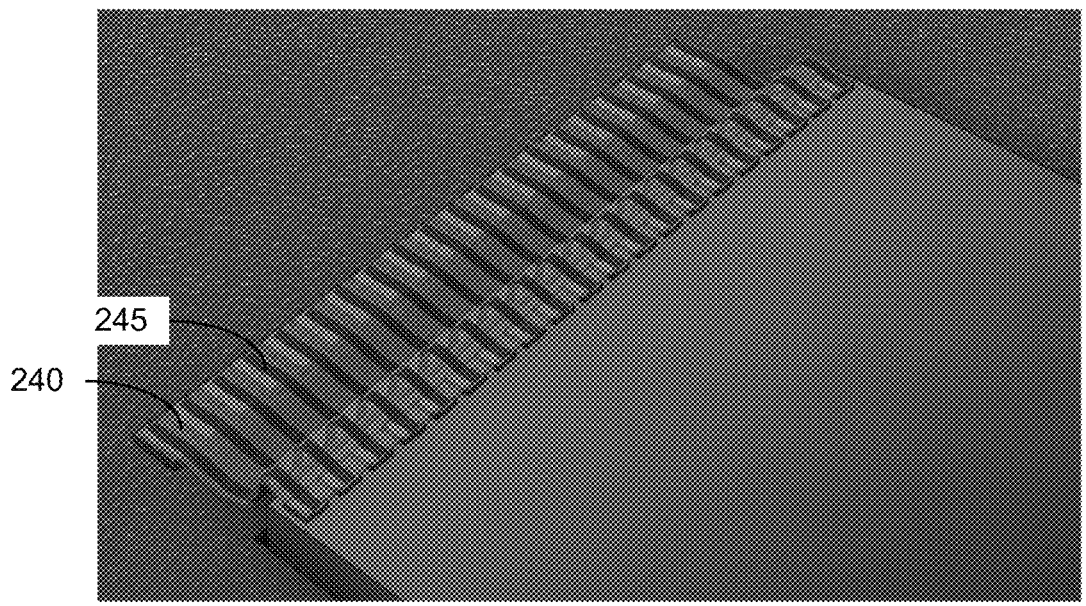
FIGS. 2A through 2C illustrate a perspective views of an integrated circuit connected to a packaging substrate using a flex cable, according to one or more embodiments.
Figure 2B:
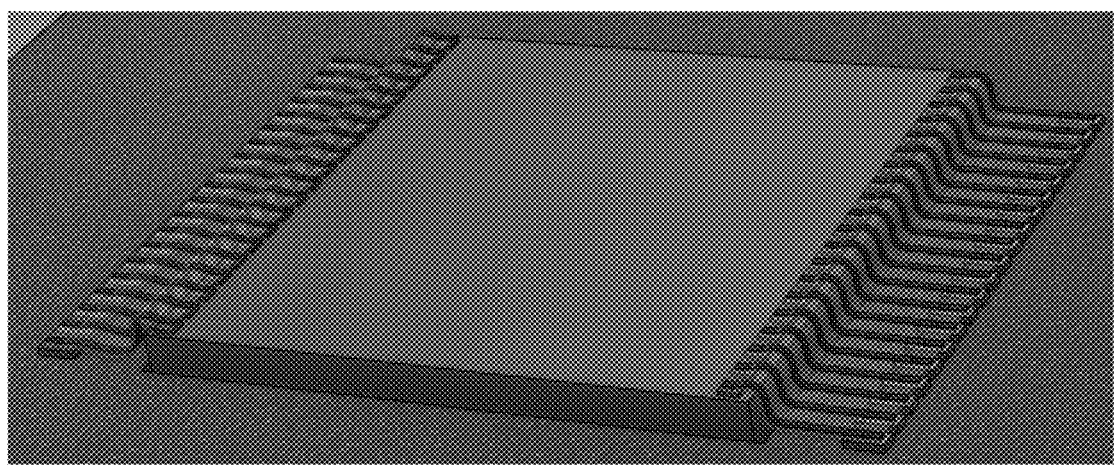
Figure 2C:
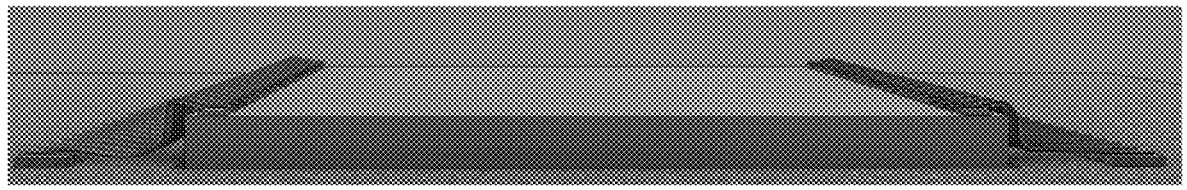
Figure 2D:
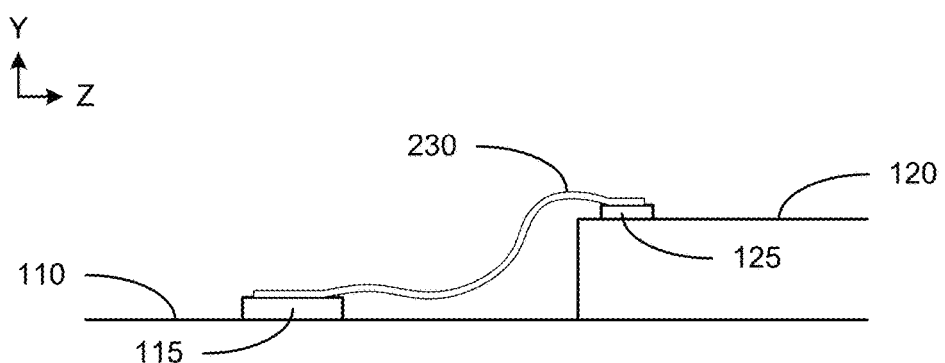
FIG. 2D illustrates a cross-sectional side view of an integrated circuit connected to a packaging substrate using a flex cable, according to one or more embodiments.

FIGS. 2A through 2C illustrate perspective views of an integrated circuit connected to a packaging substrate using a flex cable, according to one or more embodiments. FIG. 2D illustrates a cross-sectional side view of an integrated circuit connected to a packaging substrate using a flex cable, according to one or more embodiments. The flex cable 230 includes a set of conductors 245 encased in an insulating housing 240. The conductors 245 are made of a conducting material and is configured to transmit electrical signals between an integrated circuit die and a package substrate. Moreover, the insulating housing 240 is made of an insulating material and is configured to provide structural support for the conductors and electrically isolate the conductors from one another. A more detailed description of the flex cable 230 is provided herein below.

As shown in FIGS. 2A through 2D, a set of contacts 125 of the integrated circuit die 120 are connected to a corresponding set of contacts 115 of the package substrate 110 through conductors included in a flex cable. In some embodiments, all of the conductors of a flex cable may be thermosonically bonded to contacts at substantially the same time. That is, a first end of all the conductors of a flex cable may be bonded to contacts of an integrated circuit die at substantially the same time. Similarly, a second end of all the conductors of the flex cable may be bonded to contacts of a package substrate at substantially the same time. As such, an amount of time for connecting the integrated circuit die to the package substrate is reduced.

Moreover, the profile of the flex cable is smaller than the profile of bonding wires (such as the bonding wires shown in FIG. 1B). In some embodiments, the insulating housing 240 of the flex cable provides structural support for the conductors. The insulating housing may allow the conductors to be bent to follow a profile of the integrated circuit die. As such, the height occupied by the conductors of the flex cable may be reduced compared to the bonding wires shown in FIG. 1B. In addition, the insulating housing may reduce a likelihood of the conductors from breaking.

In some embodiments, the use of flex cables enables multi-layer stacking of conductors, allowing multiple rows of contacts to be bonded at the same time. Moreover, the use of flex cables may enable the incorporation of electromagnetic interference (EMI) shielding for radio frequency (RF) and other applications to prevent cross-talk and signal attenuation.

Figure 3A:
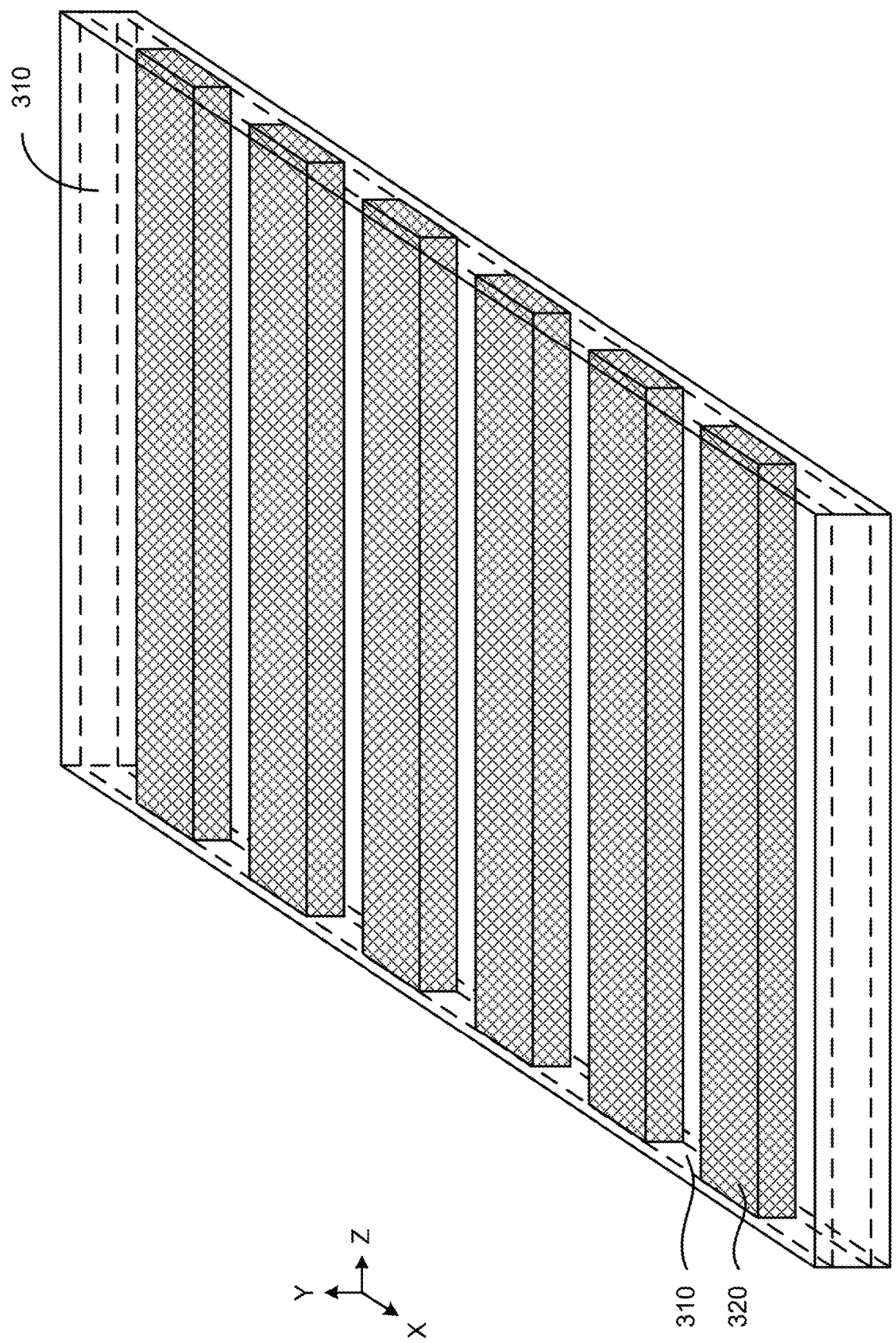
FIG. 3A illustrates a perspective view of a segment of a flex cable for connecting an integrated circuit die to a package substrate, according to one or more embodiments.
Figure 3B:
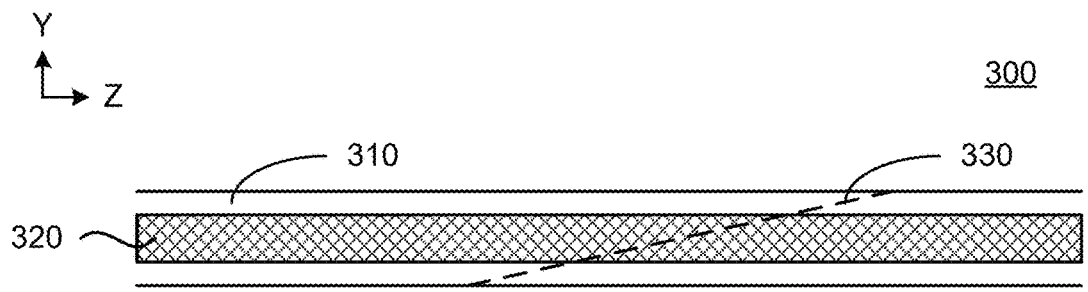
FIG. 3B illustrates a cross-sectional view across a longitudinal plane (Y-Z plane) of the flex cable of FIG. 3A, according to one or more embodiments.
Figure 3C:
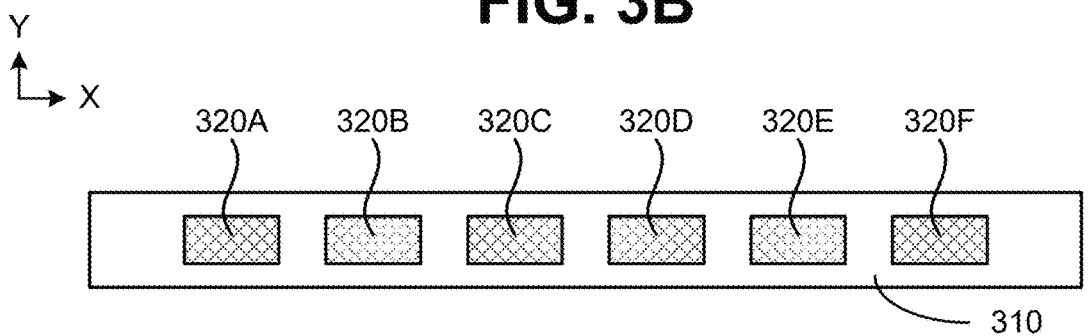
FIG. 3C illustrates a cross-sectional view across a transversal plane (X-Y plane) of the flex cable of FIG. 3A, according to one or more embodiments.

FIG. 3A illustrates a perspective view of a segment of a flex cable for connecting an integrated circuit die to a package substrate, according to one or more embodiments. FIG. 3B illustrates a cross-sectional view across a longitudinal plane (Y-Z plane) of the flex cable of FIG. 3A, according to one or more embodiments. FIG. 3C illustrates a cross-sectional view across a transversal plane (X-Y plane) of the flex cable of FIG. 3A, according to one or more embodiments. The flex cable 300 (such as the flex cable 230 shown in FIGS. 2A-B) includes a set of conductors 320 embedded inside an insulating material 310. For example, as shown in FIG. 3C, the flex cable includes six conductors 320A through 320F arranged in a conductor layer. Moreover, each of the conductors 320 are separated from a neighboring conductor by the insulating material 310. The insulating material 310 disposed between two conductors 320 prevents the two conductors from shorting.

In some embodiments, the flex cable 300 is cut along cut line 330. Specifically, the flex cable 300 is cut to expose the conductors 320 embedded within the insulating material 310, and to reduce the length of the flex cable. By cutting the flex cable along the cut line 330, a surface of each of the conductors 320A through 320F is exposed. In some embodiments, the flex cable 300 is cut at a set angle.

Figure 3D:
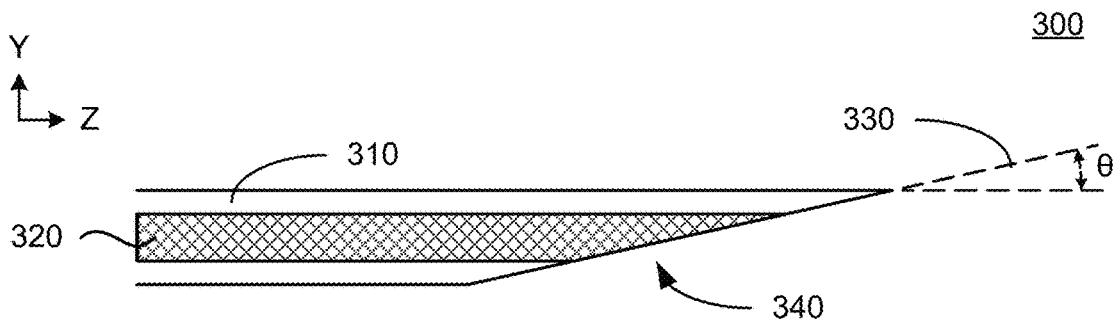
FIG. 3D illustrates a cross-sectional view of a flex cable cut at one end (e.g., the proximal end) along a cutting line, according to one or more embodiments.

FIG. 3D illustrates a cross-sectional view of a flex cable cut at one end (e.g., the proximal end) along a cutting line, according to one or more embodiments. The flex cable 300 of FIG. 3D was cut at an angle θ along cut line 330. By cutting the flex cable along cutting line 330, one end of the conductor 320 is exposed, allowing the conductor to be connected to a contact (e.g., a contact 125 of the set of contacts of the integrated circuit die 120 or a contact 115 of the set of contacts of the package substrate 110). In particular, by cutting the flex cable 300 along cut line 330, a first conductor surface 340 is formed. The first conductor surface 340 can then be connected to a contact to electrically couple the conductor to the contact. Moreover, the surface area of the first conductor surface 340 may be controlled by the cut angle θ. By increasing the cut angle θ, the surface area of the first conductor surface 340 of the conductor 320 may be increased.

Figure 3E:
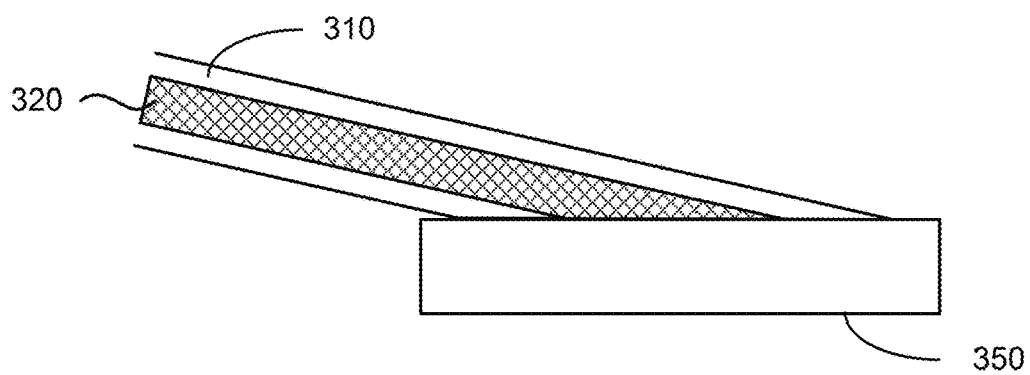
FIG. 3E illustrates a cross-sectional view of the flex cable of FIG. 3D connected to a contact (such as a contact of the set of contacts of the integrated circuit die or a contact of the set of contacts of the package substrate), according to one or more embodiments.

FIG. 3E illustrates a cross-sectional view of the flex cable of FIG. 3D connected to a contact 350 (such as a contact 125 of the set of contacts of the integrated circuit die 120 or a contact 115 of the set of contacts of the package substrate 110), according to one or more embodiments. The first conductor surface 340 of the flex cable 300 is placed over the contact 350 and bonded to the contact 350. In some embodiments, the first conductor surface 340 is bonded to the contact 350 using thermosonic bonding. Moreover, a second conductor surface (not shown) is also formed by cutting the flex cable at a second cutting line. The second cutting line may also be angled to increase the area of the second conductor surface. Moreover, the second cutting line may be cut at an angle opposite to the angle of the first cutting line. The second conductor surface is then bonded to a second contact to electrically couple the first contact bonded to the first conductor surface to the second contact bonded to the second conductor surface.

Figure 4A:
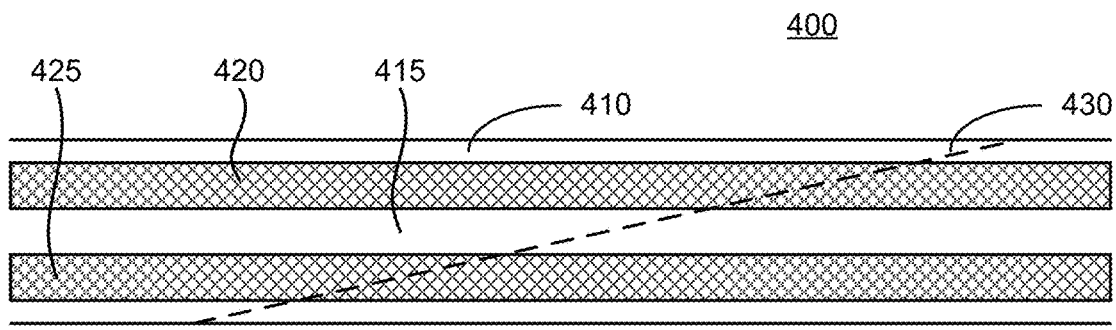
FIGS. 4A through 4C illustrate cross-sectional views across a longitudinal plane (Y-Z plane) of a flex cable having multiple layers of conductors, according to one or more embodiments.
Figure 4B:
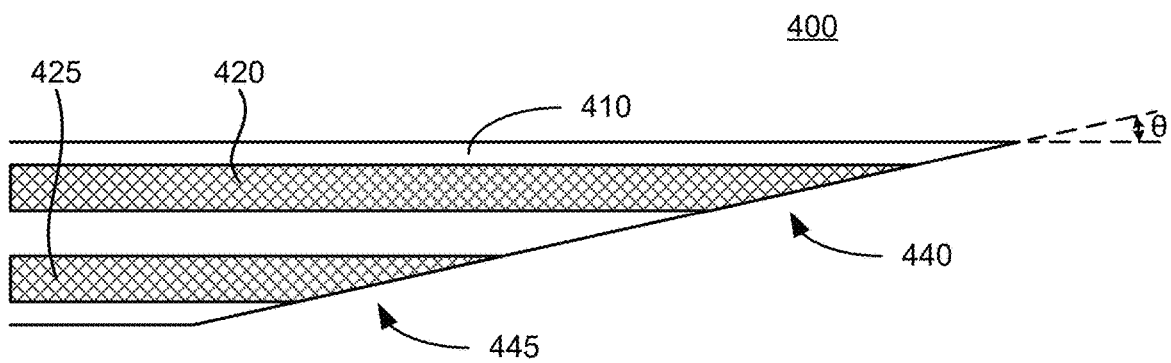
Figure 4C:
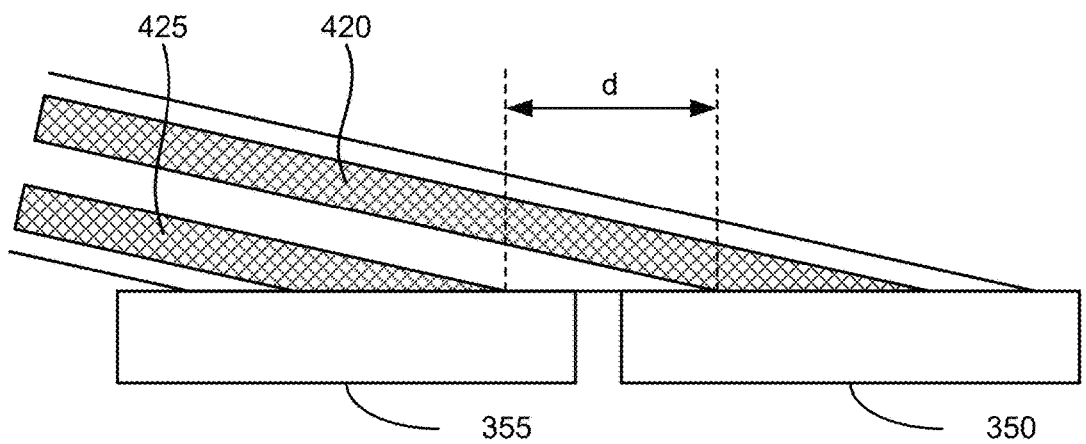

FIGS. 4A through 4C illustrate cross-sectional views across a longitudinal plane (Y-Z plane) of a flex cable having multiple layers of conductors, according to one or more embodiments. In particular, the flex cable shown in FIGS. 4A through 4C have two layers of conductors. Moreover, FIG. 4A illustrates a cross-sectional view of the flex cable before being cut along a cut line, FIG. 4B illustrates a cross-sectional view of the flex cable after being cut along the cut line, and FIG. 4C illustrates a cross-sectional view of the flex cable having multiple layers of conductors bonded to multiple contacts, according to one or more embodiments.

The flex cable 400 (such as the flex cable 230 shown in FIGS. 2A-B) includes a set of conductors arranged in multiple layers. For example, the flex cable 400 of FIGS. 4A-C include a first set of conductors 420 disposed in a first layer and a second set of conductors 425 disposed in a second layer. The first set of conductors 420 are separated from the second set of conductors 425 by an insulating layer 415. Moreover, the first set of conductors and the second set of conductors are embedded inside an insulating material 410.

In some embodiments, the flex cable 400 is cut along cut line 430. Specifically, the flex cable is cut to expose the conductors (e.g., first set of conductors 420 and second set of conductors 425) embedded within the insulating material 410. For example, by cutting the flex cable 400 along the cut line 430, a first conductor surface 440 for the first set of conductors 420 and a second conductor surface 445 for the second set of conductors 425 are exposed, allowing the conductors to be connected to a contact (e.g., a contact 125 of the set of contacts of the integrated circuit die 120 or a contact 115 of the set of contacts of the package substrate 110). For example, the first set of conductors may be connected to a first set of contacts 350 and the second set of conductors may be connected to a second set of contacts.

In some embodiments, the surface area of the exposed surfaces of the conductors of the flex cable may be controlled by controlling the cutting angle θ. As the cutting angle θ is increased, the surface area of the exposed surfaces of the conductors increases. Moreover, the separation d between the exposed surfaces of the first set of conductors and the exposed surfaces of the second set of conductors may be controlled by controlling the cutting angle θ. As the cutting angle θ is increased, the separation between the exposed surfaces of the first set of conductors and the exposed surfaces of the second set of conductors increases.

FIGS. 5A and 5B illustrate cross-sectional views across a transversal plane (X-Y plane) of the flex cable of FIG. 4A, according to various embodiments. For example, FIG. 5A illustrates a cross-sectional view across a transversal plane of a flex cable having a first set of conductors disposed in a first conductor layer aligned with a second set of conductors disposed in a second conductor layer, according to one or more embodiments. As shown in FIG. 5A, the flex cable 400 includes a first set of conductors 420 (including conductors 420A through 420F), and a second set of conductors 425 (including conductors 425A through 425F). The first set of conductors 420 are disposed in a first conductor layer 530 and the second set of conductors 425 are disposed in a second conductor layer 535. Moreover, the first set of conductors 420 are separated from the second set of conductors 425 by an insulating layer. Similarly, each conductor of the first set of conductors is separated from the other conductors from the first set of conductors by the insulating material 410. Additionally, each conductor of the second set of conductors is separated from the other conductors from the second set of conductors by the insulating material 410. As such, the number of conductors in the flex cable can be doubled compared to the flex cable 300 shown in FIGS. 3A-C.

As shown in FIG. 5A, a first conductor 420A of the first set of conductors is aligned in a first direction (vertical direction) with a first conductor 425A of the second set of conductors. Moreover, the first conductor 420A of the first set of conductors is aligned with other conductors of the first set of conductors 420 (e.g., conductors 420B through 420F) in a second direction (horizontal direction). Similarly, a second conductor 420B of the first set of conductors is aligned in the first direction with a second conductor 425B of the second set of conductors.

Moreover, FIG. 5B illustrates a cross-sectional view across a transversal plane of a flex cable having a first set of conductors disposed in a first conductor layer offset from a second set of conductors disposed in a second conductor layer, according to one or more embodiments. In the example of FIG. 5B, the conductors 425 of the second set of conductors are offset by a set amount from the conductors 420 of the first set of conductors. Specifically, a first conductor 425A of the second set of conductors is disposed between a first conductor 420A of the first set of conductors and a second conductor 420B of the first set of conductors. Similarly, the second conductor 420B of the first set of conductors is disposed between the first conductor 425A of the second set of conductors and a second conductor 425B of the second set of conductors.

Figure 6A:
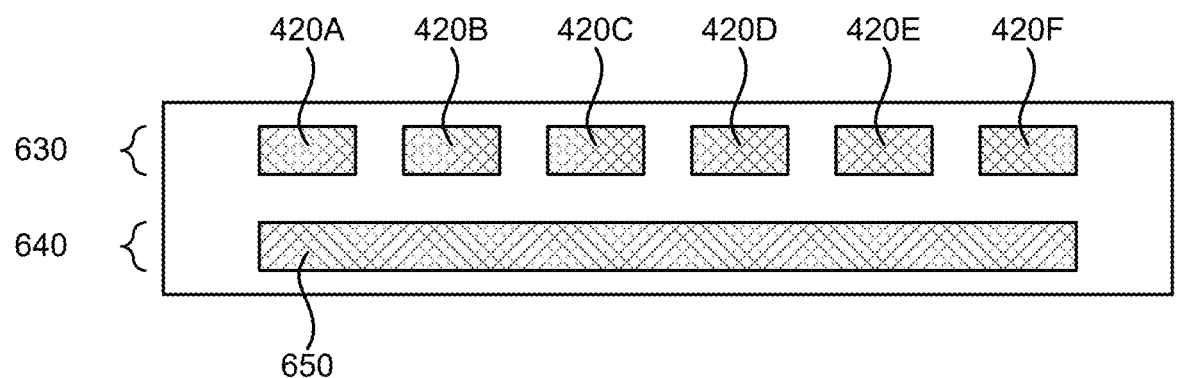
FIGS. 6A through 6C illustrate cross-sectional views across a transversal plane (X-Y plane) of a flex cable having one layer of conductors and one or more shielding layers, according to various embodiments.
Figure 6B:
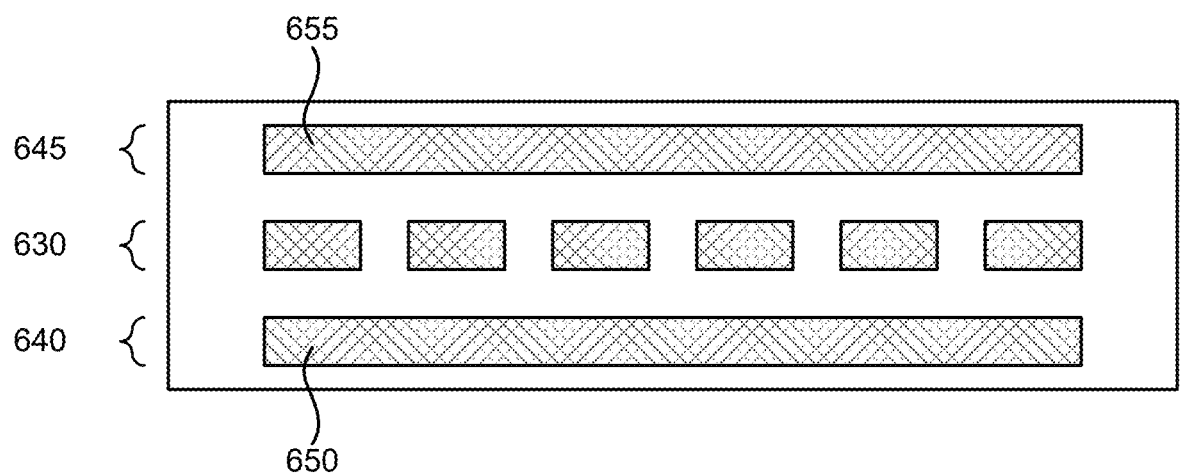
Figure 6C:
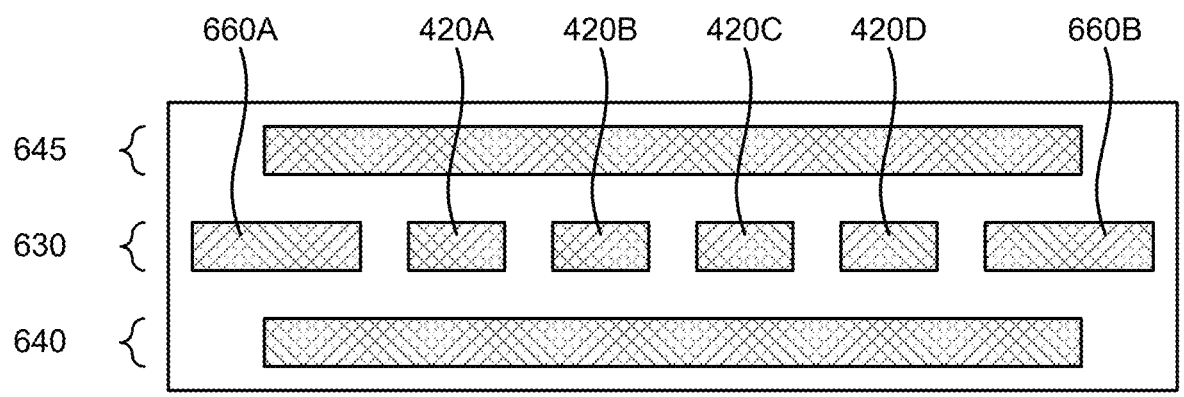

FIGS. 6A through 6C illustrate cross-sectional views across a transversal plane (X-Y plane) of a flex cable having one layer of conductors and one or more shielding layers, according to various embodiments. The shielding layer may be above and/or below the set of conductors of the flex cable, and contains a conducting plate (also referred to as shielding plane) that protects the signals being carried or transmitted through the conductors of the flex cable. In some embodiments, the conducting plate of the shielding layers is connected to ground. Moreover, in some embodiments, the conducting plate or shielding plane overlaps with the set of conductors of the flex cable.

For example, FIG. 6A illustrates a cross-sectional view across a transversal plane of a flex cable having one layer of conductors and one shielding layer, according to one or more embodiments. The flex cable includes a set of conductors 420 (including conductors 420A through 420F) arranged in a conductor layer 640. Moreover, the flex cable includes a shielding plane 650 arranged in a shielding layer 640 underneath the conductor layer 630. Moreover, the shielding layer 640 is separated from the conductor layer 630 by an insulating layer.

Moreover, FIG. 6B illustrates a cross-sectional view across a transversal plane of a flex cable having one layer of conductors and two shielding layers, according to one or more embodiments. In addition to the shielding plane 650 arranged in a shielding layer 640 underneath the conductor layer 630, the flex cable shown in FIG. 6B includes a second shielding plane 655 arranged in a second shielding layer 645 arranged over the conductor layer 630. In some embodiments, both the first shielding plane 650 and the second shielding plane 655 are configured to be grounded (e.g., by being connected to a ground terminal at the integrated circuit die and/or package substrate.

Additionally, FIG. 6C illustrates a cross-sectional view across a transversal plane of a flex cable having one layer of conductors with shielding conductors, and two shielding layers, according to one or more embodiments. That is, in addition to set of conductors 420 arranged in the conductor layer 630, the flex cable of FIG. 6C includes a first shielding conductor 660A and a second shielding conductor 660B. In some embodiments, the first shielding conductor 660A and the second shielding conductor 660B may be configured to be connected to a ground terminal at the integrated circuit die and/or package substrate. Moreover, the first shielding conductor 660A and second shielding conductor 660B may be designed to have a width larger than the width of the conductors 420 arranged in the conductor layer 630.

FIGS. 7A through 7G illustrate cross-sectional views across a transversal plane (Y-Y plane) of a flex cable having multiple layers of conductors and one or more shielding layers, according to various embodiments. For example, the flex cables shown in FIGS. 7A through 7G are illustrated as having two layers of conductors. However, flex cables may have additional layers of conductors.

Figure 7A:
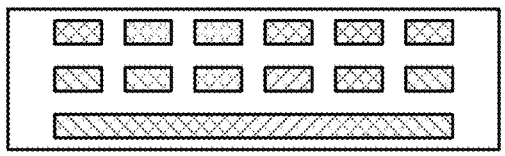
FIGS. 7A through 7G illustrate cross-sectional views across a transversal plane (Y-Y plane) of a flex cable having multiple layers of conductors and one or more shielding layers, according to various embodiments.
Figure 7B:
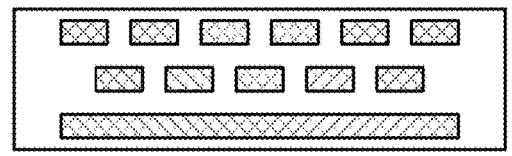
Figure 7C:
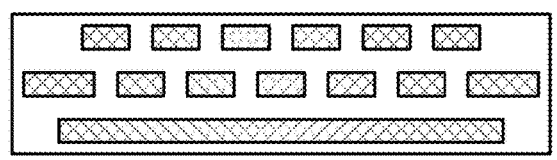
Figure 7D:
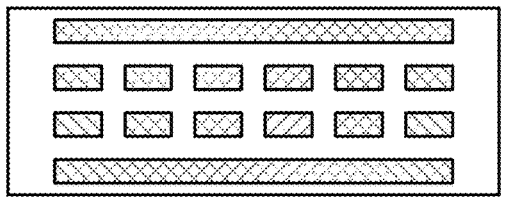
Figure 7E:
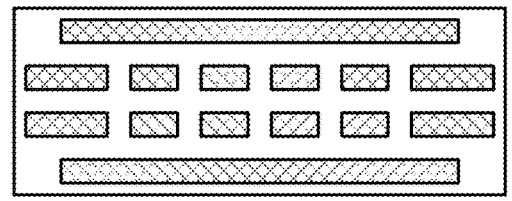
Figure 7F:
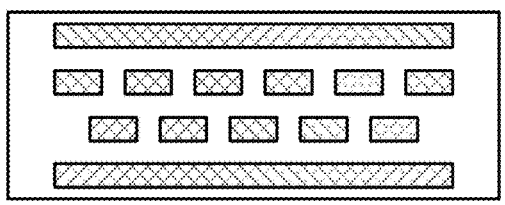
Figure 7G:
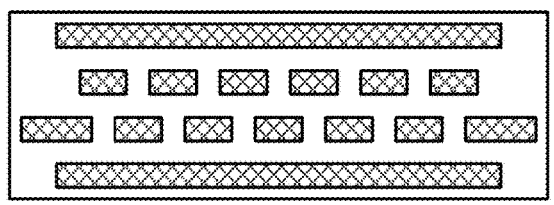

FIGS. 7A through 7C are illustrated as having one shielding layer (e.g., below a bottom conductor layer). FIGS. 7D through 7G are illustrated as having two shielding layers (e.g., one above a first conductor layer and one below a bottom conductor layer).

Moreover, the conductor layers between the shielding layers may be configured similar to the conductors shown in FIG. 5A or FIG. 5B. That is, the conductors in the first conductor layer may be aligned with the conductors of the second conductor layer (such as in FIG. 7A, 7D or 7E). Alternatively, the conductors of the second conductor layer are offset from the conductors of the first layer of conductors (such as in FIG. 7B, 7C, 7F, or 7G). Moreover, one or more of the conductor layers may include shielding conductors similar to the shielding conductors 660 shown in FIG. 6C. For example, the flex cables shown in FIGS. 7C and 7G have shielding conductors in the bottom conductor layer. In another example, the flex cable shown in FIG. 7E have shielding conductors in each of the conductor layers.

Figure 8A:
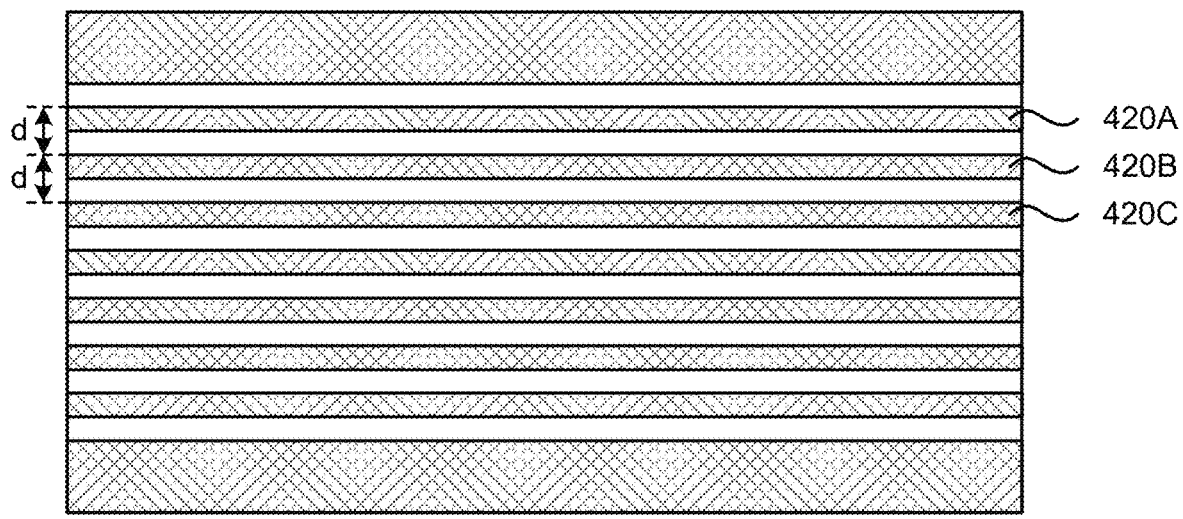
FIG. 8A illustrates a cross-sectional view of a conductor layer along the length of the flex cable, according to one or more embodiments.

Referring back to FIG. 2, in some embodiments, the conductors of the flex cable 230 are configured to have a substantially uniform pitch. For example, FIG. 8A illustrates a cross-sectional view of a conductor layer along the length of the flex cable, according to one or more embodiments. For example, the conductors 420 arranged in the conductor layer of the flex cable are separated by a distance d. Moreover, the separation of the conductors is uniform throughout the flex cable. In some embodiments, the pitch of the conductors is designed based on a contact pitch of the integrated circuit die or package substrate.

Figure 8B:
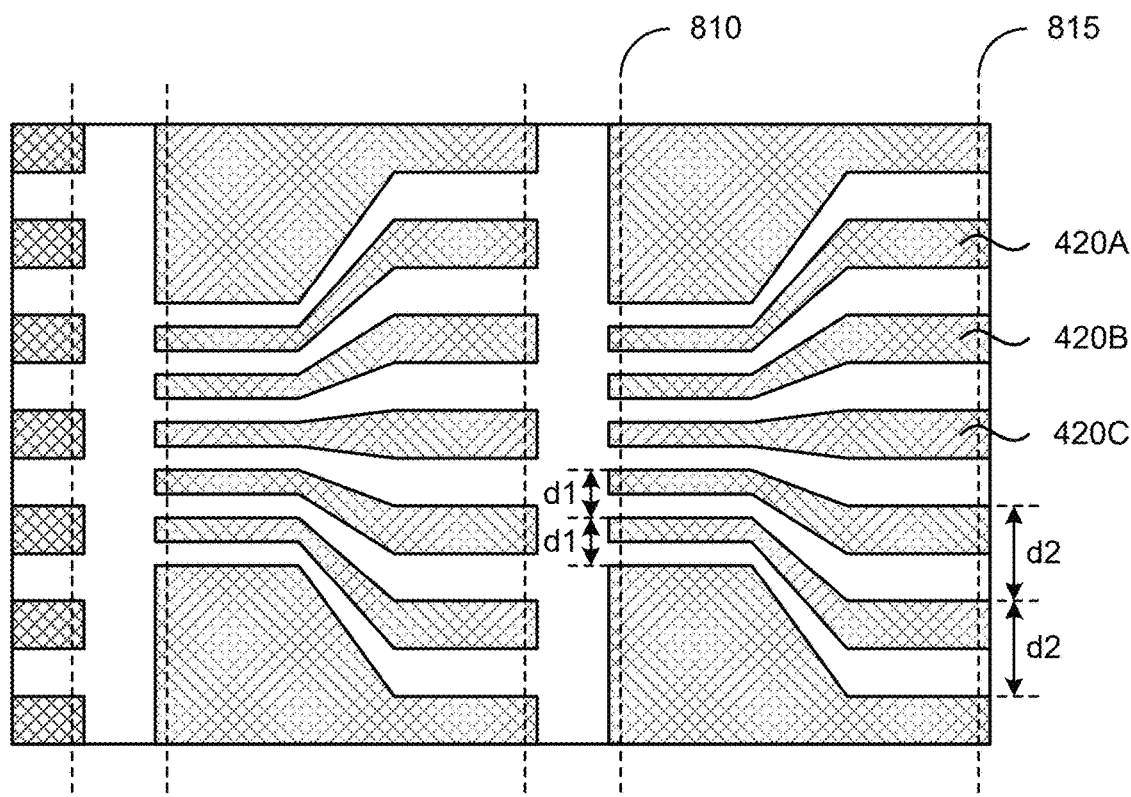
FIG. 8B illustrates a cross-sectional view of a conductor layer along the length of the flex cable having conductors that fan-out from a first end of the flex cable to a second end of the flex cable, according to one or more embodiments.

In other embodiments, the conductors of the flex cable 230 are designed to fan out from having a first pitch to having a second pitch different than the first pitch. For example, FIG. 8B illustrates a cross-sectional view of a conductor layer along the length of the flex cable having conductors that fan-out from a first end of the flex cable to a second end of the flex cable. The flex cable shown in FIG. 8 is configured to be cut along a first cut line 810 and a second cut line 815. Moreover, the conductors 420 arranged within the conductor layer are configured to be separated by a first distance d1 (i.e., arranged with a first pitch) along the first cut line 810, and configured to be separated by a second distance d2 (i.e., arranged with a second pitch) along the second cut line 815. In some embodiments, the first distance d1 is smaller than the second distance d2. As such, the conductors 420 are configured to fan-out from a first pitch (separating the conductors by a first distance d1) to a second pitch (separating the conductors by a second distance d2). In some embodiments, the conductors are configured to have a first width w1 along the first cut line 810, and configured to have a second width w2 along the second cut line/815. In some embodiments, the first width w1 is smaller than the second width w2.

In some embodiments, the width w1 and pitch of the conductors 420 along the first cut line 810 may be selected based on a contact size and contact pitch of the contacts of the integrated circuit die. For example, the width w1 and pitch of the conductors 420 along the first cut line 810 may be selected based on a semiconductor fabrication constraint of the integrated circuit die. Moreover, the width w2 and pitch of the conductors 420 along the second cut line 815 may be selected based on a contact size and contact pitch of the contracts of the package substrate. For example, the width w2 and pitch of the conductors 420 along the second cut line 815 may be selected based on a fabrication constraint of the package substrate.

Flex Connector Bonding System

Figure 9A:
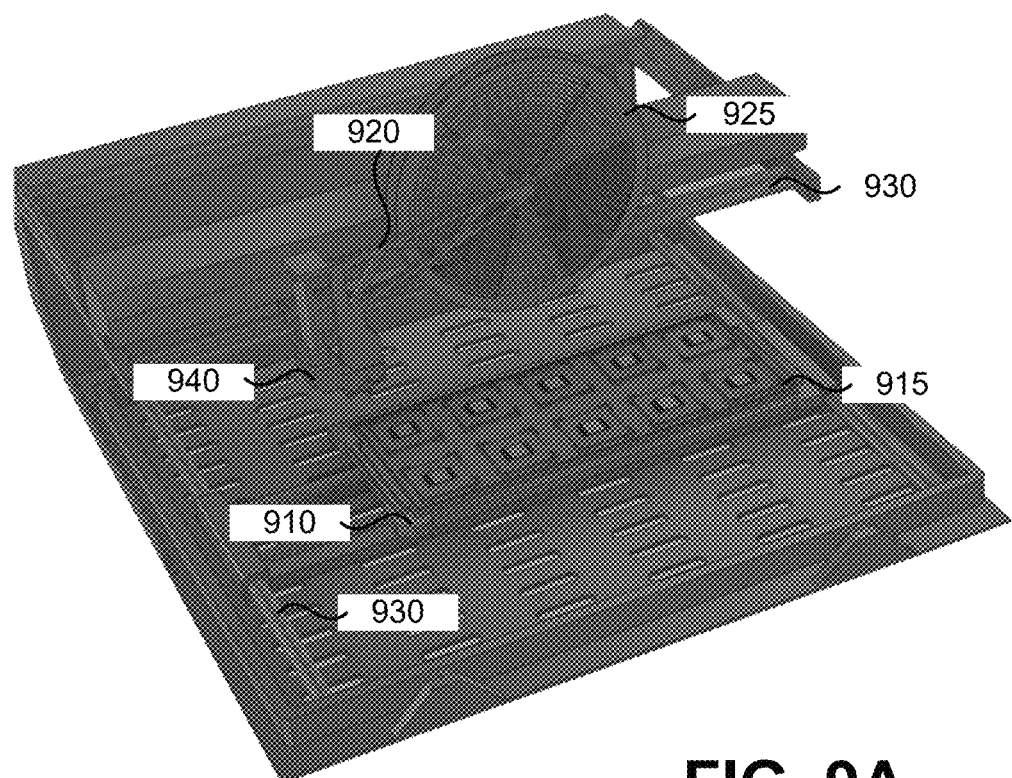
FIGS. 9A and 9B illustrate a bonding system for connecting an integrated circuit die to a package substrate, according to one or more embodiments.
Figure 9B:
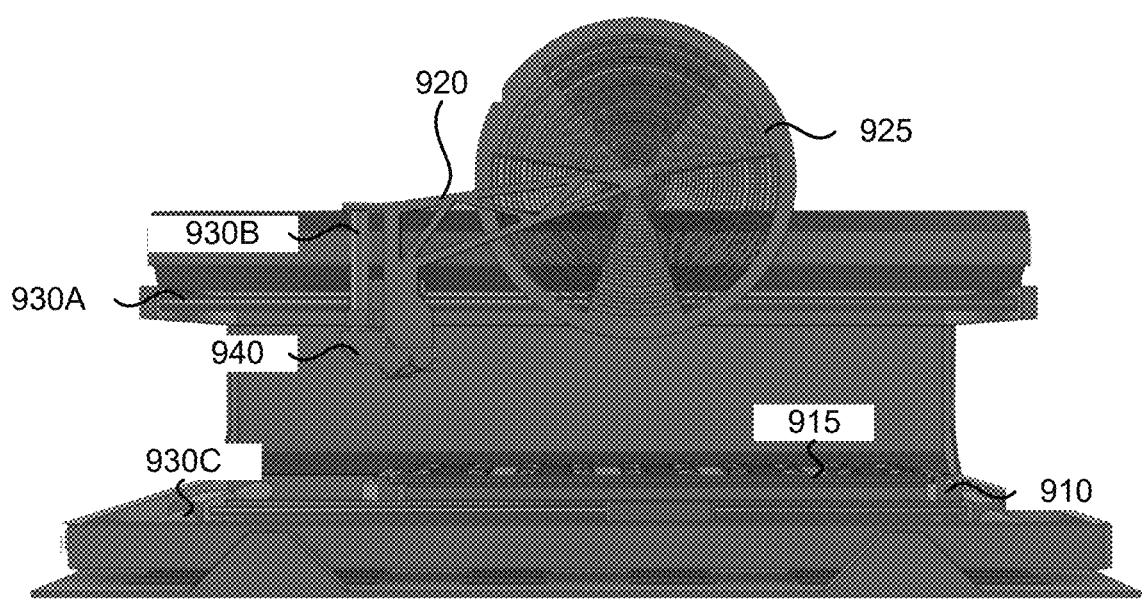

FIGS. 9A through 9C illustrate a bonding system for connecting an integrated circuit die to a package substrate, according to one or more embodiments. The bonding system includes a tray holder 910, a tray 915, a flex cable reel holder 920, a flex cable reel 925, one or more steppers 930, and a flex cable bonding head 940. In some embodiments, the bonding system includes additional, fewer, or different elements than the one shown in FIGS. 9A-B.

The tray holder 910 is configured to hold a tray 915. The tray 915 is configured to hold in place one or more package substrates. In some embodiments, the tray 915 is a Joint Electron Device Engineering Council (JEDEC) standard tray. In some embodiments, the tray 915 is configured to hold in place a set of package substrates carrying an integrated circuit die. The tray 915 may have a set of slots, each configured to fit one package substrate.

The flex cable reel holder 920 is configured to hold a flex cable reel 925. The flex cable reel 925 contains a flex cable that may be cut to size before bonding to the integrated circuit die or package substrate. In some embodiments the flex cable is spooled around a flex cable holder.

The flex cable bonding head 940 receives the flex cable, cuts the flex cable to size and to expose the conductors within the flex cable, and bonds a first end of the cut flex cable to the package substrate and a second end of the cut flex cable to the integrated circuit die. A more detailed description of the flex cable bonding head 940 is provided below in conjunction with FIG. 9C.

In some embodiments, the flex cable bonding head 940 is attached to a first stepper 9W30A. The first stepper 930A is configured to move the flex cable bonding head 940 in a first direction (e.g., left to right). Alternatively, the first stepper 930A is configured to move the flex cable bonding head 940 in two dimensions (e.g., left to right and front to back). Moreover, the flex cable bonding head 940 is attached to a second stepper 930B. The second stepper 930B is configured to move the flex cable bonding head 940 up and down to move closer or further from the tray 915 and/or the tray holder 910.

In some embodiments, the flex cable reel holder 920 is also attached to the first stepper 930A and the second stepper 930B. As such, the flex cable reel holder 920 may move in conjunction with the flex cable bonding head 940.

In some embodiments, the tray holder 910 is attached to a third stepper 930C. The third stepper 930C is configured to move the tray holder 910 in a second direction (e.g., front to back). For example, the third stepper is configured to move the tray holder 910 in a direction perpendicular to the direction of the first stepper 930A. Alternatively, the third stepper 930C is configured to move the tray holder 910 in two dimensions (e.g., left to right and front to back).

FIG. 9C illustrates a diagram of the flex cable bonding head, according to one or more embodiments. The flex cable bonding head 940 includes a flex cable channel 960, one or more flex cable cutters 970, and a thermosonic bonding head 980. In some embodiments, the flex cable bonding head 940 includes additional, fewer, or different elements than the one shown in FIG. 9C.

The flex cable channel 960 is configured to receive the flex cable from the flex cable reel 925 and direct the flex cable to the one or more cutters 970 and the thermosonic bonding head 980. The flex cable channel 960 may have a height that is based on a thickness of the flex cable. Moreover, the shape of the flex cable channel 960 may be designed based on an angle at which the flex cable is to be cut along the cutting lines (e.g., as shown in FIG. 3B or FIG. 4A).

The cutters 970 are configured to be placed along the flex cable channel 960 and are configured to cut the flex cable along one or more cut lines at a set angle. In some embodiments, the flex cable bonding head includes a first cutter 970A configured to cut the flex cable along a first cut line (e.g., at a proximal end of the flex cable), and a second cutter 970B configured to cut the flex cable along a second cut line (e.g., at a distal end of the flex cable).

The thermosonic bonding head 980 is configured to be placed an end of the flex cable channel 960 and is configured to bond the exposed conductors of the flex cable to contacts of a package substrate or an integrated circuit die. The thermosonic bonding head may provide thermal energy and vibratory motion to an end of a flex cable to physically bond each conductor of the flex cable to a corresponding contact. In some embodiments, the thermosonic bonding head 980 is configured to bond every conductor of the flex cable to corresponding contact at the same time. Moreover, the thermosonic bonding head 980 is configured to bond the shielding conductors of the flex cable to contacts on the package substrate and/or integrated circuit die.

In some embodiments, the flex cable bonding head 940 includes sensors for aligning the flex cable bonding head 940 to package substrates, integrated circuit dice, or the tray holding the package substrates and integrated circuit dice. For example, the flex cable bonding head 940 may include a camera for determining a position of the flex cable bonding head 940 with respect to the tray holding the package substrates and integrated circuit dice.

Figure 10:
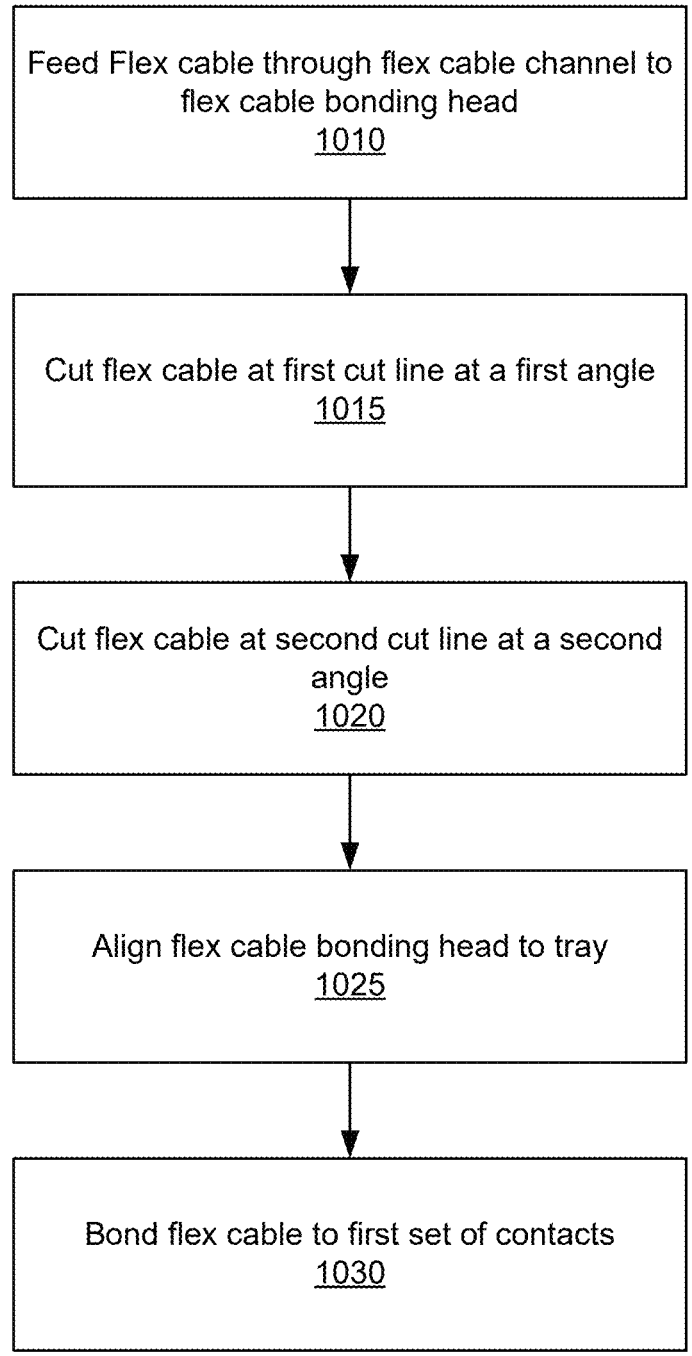
FIG. 10 illustrates a flow diagram of a process for connecting an integrated circuit die to a package substrate using a flex cable, according to one or more embodiments.

FIG. 10 illustrates a flow diagram of a process for connecting an integrated circuit die to a package substrate using a flex cable, according to one or more embodiments. To bond a flex cable to contacts on a package substrate and an integrated circuit die, a flex cable is feed 1010 through the flex cable channel 960. The flex cable is cut at a first cut 1015 line at a first angle (e.g., using the first cutter 970A) to expose a first surface the conductors embedded within the flex cable to be bonded to contacts of the integrated circuit die. Moreover, the flex cable is cut 1020 at a second cut line at a second angle (e.g., using the second cutter 970B) to expose a second surface of the conductors embedded within the flex cable to be bonded to contacts of the package substrate.

Additionally, the flex cable bonding head 940 and/or the tray holder 910 are moved to align 1025 the flex cable bonding head 940 to the tray 915 or to a package substrate or integrated circuit die carried by the tray 915. For example, the first stepper 930A and the third stepper 930C are actuated to move the flex cable bonding head 940 and the tray holder 910 to align the flex cable bonding head 940 to the tray 915.

After the flex cable bonding head 940 is aligned to the tray 915 (or the package substrate or the integrated circuit die), the flex cable bonding head 940 is lowered to approach the package substrate or the integrated circuit die. The cut flex cable is then fed and pressed against the surface of the package substrate or integrated circuit die by the thermosonic bonding head 980. The thermosonic bonding head 980 is then activated to bond 1030 the conductors of the flex cable to the corresponding contacts.

In some embodiments, after a first end of the flex cable has been bonded to a first set of contacts, the flex cable is fed through the flex cable channel 960, the flex cable bonding head is moved to a second location, and the second end of the flex cable is bonded to a second set of contacts. For example, after the first end of the flex cable has been bonded to contacts of the package substrate, the remaining of the cut flex cable is fed through the flex cable channel 960, the flex cable bonding head 940 is aligned to contacts of the integrated circuit die, and the second end of the flex cable is bonded to the contacts of the integrated circuit die. Alternatively, after the first end of the flex cable has been bonded to contacts of the integrated circuit die, the remaining of the cut flex cable is fed through the flex cable channel 960, the flex cable bonding head 940 is aligned to contacts of the package substrate, and the second end of the flex cable is bonded to the contacts of the package substrate.

ADDITIONAL CONSIDERATIONS

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. An integrated circuit package comprising:
   an integrated circuit die implementing an integrated circuit, the integrated circuit die comprising a first plurality of contacts;
   a package substrate comprising a second plurality of contacts, each contact of the second plurality of contacts configured to be coupled to a contact of the first plurality of contacts; and
   a flex cable comprising:
   an insulating housing made of an insulating material, and
   a plurality of conductors embedded inside the insulating housing, each conductor of the plurality of conductors connected to a first contact of the first plurality of contacts and a second contact of the second plurality of contacts, wherein the plurality of conductors comprises a first set of conductors arranged in a first conductor layer formed in a first plane and a second set of conductors arranged in a second conductor layer formed in a second plane parallel to and spaced from the first plane in a first direction, wherein the second set of conductors are offset from the first set of conductors along a second direction normal to the first direction, wherein the flex cable is cut at an angle through the flex cable from a first surface of the flex cable to a second surface of the flex cable to expose the first set of conductors and the second set of conductors.

2. The integrated circuit package of claim 1, wherein one conductor of the first set of conductors forms a first obtuse, internal angle at a first end to expose a first surface of the one conductor, and forms a second obtuse, internal angle to expose a second surface of the one conductor.

3. The integrated circuit package of claim 2, wherein the first obtuse, internal angle and the second obtuse, internal angle are selected based on a surface area of the first and second surfaces of the plurality of conductors.

4. The integrated circuit package of claim 1, wherein the plurality of conductors are thermosonically bonded to the first plurality of contacts and the second plurality of contacts.

5. The integrated circuit package of claim 1, wherein the flex cable further comprises:
   a first shielding plane overlapping the plurality of conductors of the flex cable, the first shielding plane configured to be connected to at least one of a first ground terminal of the integrated circuit die or a second ground terminal of the package substrate, wherein the first shielding plane is disposed in the first direction relative to the second conductor layer;
   a first shielding conductor disposed in the second conductor layer and connected to at least one of the first ground terminal or the second ground terminal; and
   a second shielding conductor disposed in the second conductor layer and connected to at least one of the first ground terminal or the second ground terminal, wherein the second set of conductors are disposed between the first shielding conductor and the second shielding conductor,
   wherein the first conductor layer and the second conductor layer are in contact with an insulating layer of the insulating housing.

6. The integrated circuit package of claim 1, wherein the flex cable further comprises:
   a first shielding plane and a second shielding plane, the first shielding plane and the second shielding plane overlapping the plurality of conductors of the flex cable, wherein the plurality of conductors of the flex cable are disposed between the first shielding plane and the second shielding plane.

7. The integrated circuit package of claim 1, wherein the first conductor layer and the second conductor layer are separated by an insulating layer.

8. The integrated circuit package of claim 7, wherein the angle for cutting the flex cable is selected based on a separation between a first row of contacts and a second row of contacts of the plurality of contacts of the integrated circuit die.

9. The integrated circuit package of claim 1, wherein the plurality of conductors are configured to fan out from a first end of the flex cable to a second end of the flex cable, wherein the plurality of conductors are separated by a first distance at the first end of the flex cable and separated by a second distance at the second end of the flex cable, the second end larger than the first end.

10. The integrated circuit package of claim 9, wherein the integrated circuit die is fabricated using a first fabrication process having a first feature size, and wherein the package substrate is fabricated using a second fabrication process having a second feature size, larger than the first feature size.

11. A method for connecting an integrated circuit die to a package substrate, comprising:
    cutting, by a flex cable bonding head, a flex cable along a first cut line at a first angle through the flex cable from a first surface of the flex cable to a second surface of the flex cable to expose a first surface of a plurality of conductors of the flex cable, wherein the plurality of conductors is embedded inside an insulating house of the flex cable, wherein the plurality of conductors comprises a first set of conductors arranged in a first conductor layer formed in a first plane and a second set of conductors arranged in a second conductor layer formed in a second plane parallel to and spaced from the first plane in a first direction, wherein the second set of conductors are offset from the first set of conductors along a second direction normal to the first direction;
    cutting, by the flex cable bonding head, the flex cable along a second cut line at a second angle to expose a second surface of the plurality of conductors of the flex cable;
    aligning the flex cable bonding head to a first plurality of contacts of the integrated circuit die;
    thermosonically bonding the first surface of the plurality of conductors to the first plurality of contacts of the integrated circuit die;
    aligning the flex cable bonding head to a second plurality of contacts of the package substrate; and
    thermosonically bonding the second surface of the plurality of conductors to the second plurality of contacts of the package substrate.

12. The method of claim 11, wherein the first angle and the second angle are selected based on a surface area of the first and second surfaces of the plurality of conductors.

13. The method of claim 11, wherein the flex cable further comprises:
- a first shielding plane overlapping the plurality of conductors of the flex cable, the first shielding plane configured to be connected to at least one of a first ground terminal of the integrated circuit die or a second ground terminal of the package substrate, wherein the first shielding plane is disposed in the first direction relative to the second conductor layer;
- a first shielding conductor disposed in the second conductor layer and connected to at least one of the first ground terminal or the second ground terminal; and
- a second shielding conductor disposed in the second conductor layer and connected to at least one of the first ground terminal or the second ground terminal, wherein the second set of conductors are disposed between the first shielding conductor and the second shielding conductor,
- wherein the first conductor layer and the second conductor layer are in contact with an insulating layer of the insulating housing.

14. The method of claim 11, wherein the flex cable further comprises a first shielding plane and a second shielding plane, the first shielding plane and the second shielding plane overlapping the plurality of conductors of the flex cable, wherein the plurality of conductors of the flex cable are disposed between the first shielding plane and the second shielding plane.

15. The method of claim 11, wherein the first angle for cutting the flex cable at the first cut line is selected based on a separation between a first row of contacts and a second row of contacts of the first plurality of contacts of the integrated circuit die.

16. The method of claim 11, wherein the plurality of conductors of the flex cable are configured to fan out from a first end of the flex cable to a second end of the flex cable, wherein the plurality of conductors are separated by a first distance at the first end of the flex cable and separated by a second distance at the second end of the flex cable, the second end larger than the first end.

17. The method of claim 11, wherein the integrated circuit die is fabricated using a first fabrication process having a first feature size, and wherein the package substrate is fabricated using a second fabrication process having a second feature size, larger than the first feature size.

18. A system for connecting an integrated circuit die to a package substrate comprising:
- a tray holder for holding a tray carrying one or more integrated circuit stacks having the package substrate and the integrated circuit die; and
- a flex cable bonding head comprising:
- a first cutter for cutting a flex cable along a first cut line at a first angle through the flex cable from a first surface of the flex cable to a second surface of the flex cable to expose a first surface of a plurality of conductors of the flex cable, wherein the plurality of conductors is embedded inside an insulating housing of the flex cable, wherein the plurality of conductors comprises a first set of conductors arranged in a first conductor layer formed in a first plane and a second set of conductors arranged in a second conductor layer formed in a second plane parallel to and spaced from the first plane in a first direction, wherein the second set of conductors are offset from the first set of conductors along a second direction normal to the first direction,
- a second cutter for cutting the flex cable along a second cut line at a second angle to expose a second surface of the plurality of conductors of the flex cable, and
- a thermosonic bonding head for bonding the first surface of the plurality of conductors to a first plurality of contacts of the integrated circuit die and bonding the second surface of the plurality of conductors to a second plurality of contacts of the package substrate.

19. The system of claim 18, further comprising a first stepper configured to move the flex cable bonding head, wherein the first conductor layer and the second conductor layer are in contact with an insulating layer of the insulating housing.

20. The system of claim 18, wherein the thermosonic bonding head is configured to bond the plurality of conductors to corresponding contacts at a substantially same time.

* * * * *